US007006447B1

United States Patent
Väisänen et al.

(10) Patent No.: US 7,006,447 B1
(45) Date of Patent: Feb. 28, 2006

(54) APPARATUS, AND ASSOCIATED METHOD, FOR MEASURING RADIO OPERATING CHARACTERISTICS OF A RADIO DEVICE

(75) Inventors: Ari Väisänen, Tampere (FI); Pekko Orava, Tampere (FI); Pia Miettinen, Tampere (FI)

(73) Assignee: Nokia Mobile Phones Ltd., Espoo (FI)

( * ) Notice: Subject to any disclaimer, the term of this patent is extended or adjusted under 35 U.S.C. 154(b) by 0 days.

(21) Appl. No.: 09/558,974

(22) Filed: Apr. 27, 2000

(51) Int. Cl.
  *H04L 12/48* (2006.01)
(52) U.S. Cl. .................. 370/252; 370/332; 370/338; 370/401; 455/67.1
(58) Field of Classification Search ............... 370/349, 370/350, 248, 249, 245, 252
  See application file for complete search history.

(56) References Cited

U.S. PATENT DOCUMENTS 5,450,616 A * 9/1995 Rom .......................... 455/69
5,809,115 A * 9/1998 Inkinen .................... 379/93.05
6,259,675 B1 * 7/2001 Honda ........................ 370/248
6,272,322 B1 * 8/2001 Su ............................ 455/67.14

FOREIGN PATENT DOCUMENTS

EP          412392 A2    2/1991
WO       WO 96/38935    12/1996

\* cited by examiner

Primary Examiner—Alpus H. Hsu
Assistant Examiner—Justin Philpott
(74) Attorney, Agent, or Firm—Foley & Lardner LLP

(57) ABSTRACT

Apparatus, and an associated method, provides for field-testing and calibration of a WLAN device. In testing of the receive portion of the WLAN device, test apparatus is provided with a transmit signal of known characteristics. The test apparatus selectably attenuates the transmit signal to form an attenuated signal. The WLAN device is connected to receive the transmit signal, once attenuated by the test apparatus. Responsive to differences between measured and calculated characteristics of the transmit signal, calibration for determination of proper operation of the WLAN device is made and calibration of the WLAN device is effectuated.

17 Claims, 3 Drawing Sheets

APPARATUS, AND ASSOCIATED METHOD, FOR MEASURING RADIO OPERATING CHARACTERISTICS OF A RADIO DEVICE

The present invention relates generally to a manner by which at least to measure a radio operating characteristic of a radio device, such as a WLAN (Wireless Local Area Network). More particularly, the present invention relates to apparatus, and an associated method, for measuring transmit performance of a WLAN, or other radio, device and for measuring receive performance of the WLAN, or other radio, device. Measurement of the performance of the radio device is made, e.g., to test for proper operation of, or to calibrate, the portions of the radio device. Such measurement of the WLAN, or other radio, device is performed in conjunction with a control radio device which exhibits known levels of performance.

BACKGROUND OF THE INVENTION

Advancements in communication technologies have permitted the introduction, and popularization, of new types of, and improvements in existing, communication systems. Increasingly large amounts of data are communicated at increased throughput rates by using such new, or improved, communication systems. As a result of such advancements, communications requiring high data throughput rates, previously unfeasible, are now possible. Communication systems utilizing, or predicated upon, digital communication techniques are, for instance, increasingly utilized better to communicate digital data, and the use of such digital communication techniques has facilitated the increase permitted of data throughput rates.

When digital communication techniques are used, information which is to be communicated is digitized. In one technique, the digitized information is formatted into packets and, once formatted, the data is communicated upon a communication channel, thereby to be transmitted to a destination. Individual ones, or groups, of the packets or frames of data can be communicated at discrete intervals and, once communicated, concatenated together to recreate the informational content contained therein.

Because data formatted in this manner can be communicated at the discrete intervals, a communication channel need not be dedicated solely for the communication of data generated by one sending station to one receiving station, as conventionally required in circuit-switched communications. Instead, a single channel can be shared amongst a plurality of different sending and receiving station-pairs. Because a single channel can be utilized to effectuate communications by the plurality of pairs of communication stations, improved communication capacity is possible.

A conventional LAN (Local Area Network) is exemplary of a communication system in which packets of data are communicated to effectuate the communication of information. WLANs (Wireless Local Area Networks), operable in manners analogous to wired LANs, have also been developed and are utilized to communicate packets of data over a radio link. The IEEE 802.11 standard promulgated by the IEEE (Institute of Electrical and Electronic Engineers) defines an exemplary WLAN communication system, referred hereinafter sometimes as a "WLAN." In such a communication system, WLAN devices, such as laptop, or other, portable computing devices are connectable to other such devices by way of radio link connections therebetween, such as by way of a WLAN infrastructure. The laptop, or other portable, computing device is, for instance, connected together with a Bluetooth-based, or other radio transceiver. The infrastructure of the WLAN system includes corresponding transceiver devices, referred to as access points, thereby to permit communication of data between the WLAN device and the infrastructure of the WLAN system.

The IEEE 802.11 standard sets forth various system operating parameter requirements. During operation of the WLAN system, for instance, measurements of the power levels of transmitted signals are made. Namely, RSSI (Received Signal Strength Indicator) measurements are made and utilized during operation of the WLAN system. Responsive to such measurements, various operational selections pertaining to various actions are made. For instance, handover of communications with the WLAN device and various radio transceivers, i.e., access points, of the network infrastructure are made responsive to values of the RSSI measurements. Additionally, background scanning, diversity antenna selection, as well as other actions are triggered responsive to values of the measure RSSI levels. Such measurements can further be utilized, for instance, in estimation of coverage areas pursuant to a measuring campaign.

The IEEE 802.11 standard related to a WLAN system, however, does not set forth accuracy requirements related to RSSI measurements of devices operable in such a system. And, the accuracy required in RSSI measurements is dependent upon the action which is to be triggered responsive to the values obtained from such measurements. For instance, the accuracy required of a RSSI measurement is of modest criticality when used to determine whether to effectuate a handover of communications or when selecting which antenna of two, or more, diversity antennas is to be made. The lessened criticality required of RSSI measurement accuracy in such situations is due to the relative nature required of the measurements. That is to say, measurements are made of signals generated by two of the access points of the infrastructure of the WLAN system. In contrast, RSSI measurement accuracy is of increased criticality in, for instance, measurements of coverage areas.

Different WLAN devices are utilized in different manners and the criticality of the RSSI measurement accuracy of such devices is correspondingly different. WLAN devices used in applications in which RSSI measurement accuracy is critical must be calibrated in a manner which permits the RSSI measurement accuracy of the device to be commensurately accurate. Conversely, WLAN devices which are not utilized in applications which require the same level of calibration accuracy do not accordingly need to be calculated with the same level of accuracy. Factory calibration of the WLAN devices at the differing levels of calibration accuracy, depending upon the prospective use of the WLAN device, would be logistically difficult. If, however, all the WLAN devices are calibrated at the high level of RSSI measurement accuracy, additional production time would be required to perform such calibration.

A manner by which to field-calibrate the WLAN device would therefore be advantageous. Only those WLAN devices which require the high level of RSSI measurement accuracy would be calibrated to the high measurement accuracy level.

A manner by which to measure the performance of a WLAN device without requiring the use of expensive or complicated measuring apparatus would also be advantageous.

It is in light of this background information related to the operation of a WLAN, or other radio, system that the significant improvements of the present invention have evolved.

SUMMARY OF THE INVENTION

The present invention, accordingly, advantageously provides apparatus, and an associated method, by which to measure a radio operating characteristic of a WLAN (Wireless Local Area Network), or other radio, device.

Operation of an embodiment of the present invention permits field-measurement of transmit or receive performance of the radio device through the use of relatively simple and inexpensive apparatus. Measurement of the transmit or receive performance of the radio device is made in conjunction with a control radio device which exhibits known levels of performance.

In one aspect of the present invention, a manner is provided by which to calibrate the receive portion of a WLAN device to ensure the accuracy of the RSSI (Received Signal Strength Indicator) level measurements performed by the receive portion. Another WLAN device, having known transmit performance levels, is used as a control device. The control device and the WLAN device undergoing calibration are connected together by way of test apparatus including a variable attenuator. The control device is caused to generate a transmit signal of known characteristics, and the transmit signal is applied to the variable attenuator to be selectably attenuated thereat. Once attenuated, the transmit signal is applied to the WLAN device undergoing testing. Because the characteristics of the transmit signal, when sent by the control device and the amount of attenuation by which the testing apparatus attenuates the transmit signal are known, the value of the RSSI level which should be measured by the WLAN device undergoing test is known. And, through operation of the WLAN device undergoing test, the difference between the measured RSSI level and the actual RSSI level is determinable. The difference between the measured and the actual values are used to calibrate the WLAN device undergoing test. Such procedures are analogously used to calibrate the receive portion of other types of radio devices.

In another aspect of the present invention, a manner is provided by which to test the receive portion of a WLAN device, such as a WLAN phone, a WLAN PC card, an integrated WLAN PCI card, or an USB (Universal Serial Bus) standard compliant WLAN device. The WLAN device undergoing testing is connected to another WLAN device having known characteristics. The WLAN device which exhibits known characteristics forms a control device. The control device is connected to the WLAN device undergoing testing by way of test apparatus which includes a variable attenuator. The control device is caused to generate a transmit signal of known characteristics. The transmit signal is applied to the variable attenuator of the test apparatus which attenuates the signal applied thereto at a known level of attenuation. The transmit signal is, for instance, of a known power level. Such values are stored at a measurement log, and the transmit signal, once attenuated at the variable attenuator, is applied to the WLAN device undergoing testing. If the PER and the value of RSSI levels measured at the WLAN device undergoing test deviate from reference values, the receive portion of the WLAN device undergoing test is known, thereby, to be faulty.

In another aspect of the present invention, a manner is provided for testing the transmit portion of a WLAN device. The WLAN device undergoing testing is connected to a WLAN device which exhibits known receive characteristics by way of test apparatus which includes a variable attenuator. The WLAN device undergoing testing is caused to generate a transmit signal which is applied the variable attenuator of the test apparatus. The transmit signal generated by the WLAN device undergoing test is of a selected transmit power level, a selected transmit frequency level, and a selected data rate. When applied to the test apparatus, the variable attenuator thereof attenuates the signal applied thereto and provides the transmit signal, once attenuated, to the control device. Measurement is made of the RSSI level of the transmit signal and provides indications of values of the data contained in the transmit signal. Such information is recorded. The procedure is repeated with transmit signals of various different selected characteristics caused to be generated by the WLAN device undergoing testing. The transmitted power of the transmit signal generated by the WLAN device undergoing testing is calculated based upon the setting of the variable attenuator and the recorded information of the signal received at the control device, subsequent to attenuation. The results are compared with reference values, thereby to determine whether the WLAN device undergoing testing is functioning properly.

In one implementation, WLAN devices operable in a WLAN system operable pursuant to the promulgations of the IEEE 802.11 standard are tested to ensure their proper operation. Calibration of the WLAN device is also performable pursuant to operation of an embodiment of the present invention. Testing and calibration need not be performed during manufacture of the WLAN device. Rather, test apparatus is provided by which to permit field-testing and field-calibration of the WLAN device through the use of test apparatus including a variable attenuator. A WLAN device undergoing testing is connected to a control device by way of the test apparatus. During testing of the WLAN device, proper operation and calibration of the device is determined and performed.

In these and other aspects, therefore, apparatus, and an associated method, is provided for a WLAN having a first WLAN device and at least a second WLAN device. Each of the first and at least second WLAN devices are capable of communicating WLAN data. The first WLAN device and the second WLAN device are selectably connected theretogether. A variable attenuator has a first port connectable to the first WLAN device and a second port connectable to the second WLAN device. A first WLAN device-generated signal is selectably applied to the first port when the first port is connected to the first WLAN device. The variable attenuator attenuates the first WLAN device-generated signal at a selected attenuation level and provides an attenuated signal at the second port thereof.

A more complete appreciation of the present invention and the scope thereof can be obtained from the accompanying drawings, which are briefly summarized below, the following detailed description of the presently-preferred embodiments of the invention, and the appended claims.

DETAILED DESCRIPTION OF THE PREFERRED EMBODIMENT

Figure 1:
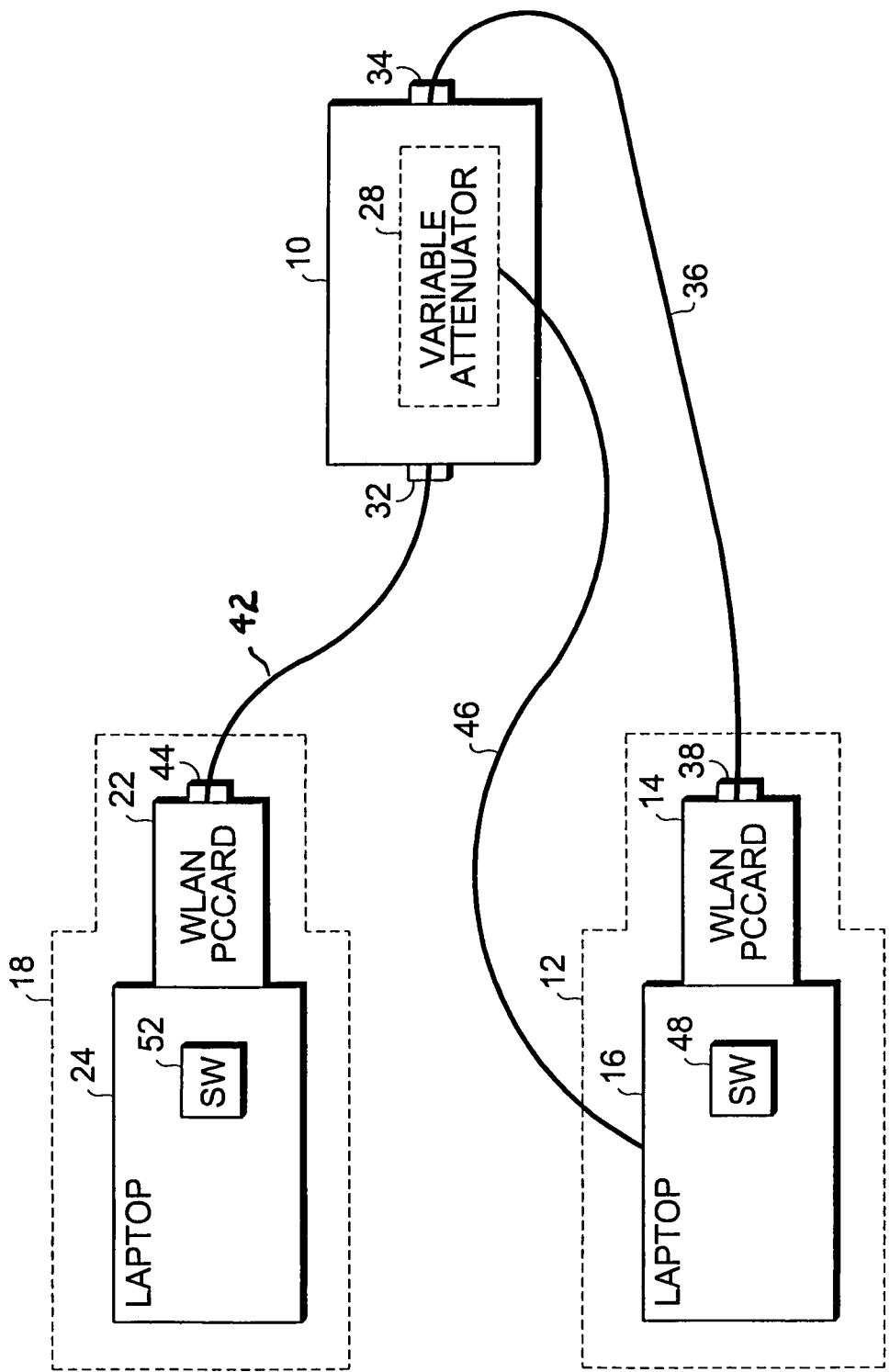
FIG. 1 illustrates a functional block diagram of test apparatus of an embodiment of the present invention positioned to permit calibration of a WLAN device undergoing test.

Referring first to FIG. 1, test apparatus, shown generally at 10, of an embodiment of the present invention is operable to calibrate a WLAN (Wireless Local Area Network) device 12, here to ensure that the measurements of an RSSI (Received Signal Strength Indicator) level is accurate. The WLAN device 12 is exemplary of a radio device which transceives communication signals. Here, the WLAN device 12 forms the device under test (dut). In other implementations, operation of the test apparatus analogously permits calibration of a radio device operable in a corresponding other type of radio communication system.

Here, the WLAN device 12 includes a WLAN PC (Personal Computer) CARD 14 and a laptop computer 16 formed of a portable computing device. The laptop computer 16, in the exemplary implementation, includes a PCMCIA port at which the WLAN PCCARD 14 is connected. The WLAN PCCARD is connected to the computer in conventional manner by inserting the PCCARD into the PCMCIA port. The WLAN PCCARD 14 is operable to transceive WLAN data, here pursuant to the IEEE 802.11 standard.

The Figure also illustrates a second WLAN device 18, also formed of a WLAN PCCARD and laptop computer, here a WLAN PCCARD 22 and a laptop computer 24. The WLAN device 18 is of known transmit operating characteristics and, during operation of an embodiment of the present invention, forms a control device for the WLAN device 12 forming the device under test.

The test apparatus 10 includes a variable attenuator 28, an input port 32, and an output port 34. The variable attenuator is connected at a first side thereof to the input port and at a second side to the output port. The variable attenuator is formed, for example, of a resistive step circuit have a plurality of resistors switchable into and out of the circuit which forms the variable attenuator. Electrical, or mechanical, switching of the resistors into and out of the circuit, implemented in conventional manner, is used to control selection of the resistance, and, hence, attenuation level of, the variable attenuator.

A coaxial cable 36 is connected, at a first portion thereof, to the output port 34 of the test apparatus. A second end portion of the coaxial cable 36 is connected to an antenna connector 38 of the WLAN PCCARD 14. Analogously, a coaxial cable 42 is connected at a first end portion thereof to the input port 32 of the test apparatus and at a second end portion thereof to an antenna connector 44 of the WLAN PCCARD 22. When both the devices 12 and 18 are connected to the test apparatus by way of the respective coaxial cables 36 and 42, a communication path is formed, by way of the test apparatus and the coaxial cables between the devices 12 and 18. A transmit signal, of known characteristics, generated by the WLAN device 18, here forming the control device, is transmitted to the WLAN device 12, forming the device under test.

The test apparatus 10 is here further shown to be connected, by way of a cable 46, to the laptop computer 16. Control software 48 executable at the laptop computer 16 causes generation of control signals, communicated upon the cable 46 to the test apparatus to control operation of the test apparatus, such as to select the attenuation level of the variable attenuator 28. Additional software 52 is embodied at the laptop computer 24, also executable pursuant to operation of an embodiment of the present invention, during calibration procedures to calibrate the WLAN device 12. Additional control signals generated by the control software 48 control generation of the transmit signal generated by the control device formed of the WLAN device 18. The control software 48 includes, for instance, a control interface to facilitate effectuation of the control signals.

When the WLAN device 12 is to be calibrated, the device 12 is connected to the test apparatus 10, as illustrated, as is also the WLAN device 18 forming the control device. The WLAN PCCARD 22 of the control device is switched into the broadcast transmit mode through appropriate execution of the software 52 embodied in the laptop computer 24. The software 52, for instance, forms a portion of a calibration accessory package installed at the laptop computer 24.

When in the broadcast transmit mode, the control device of which the WLAN device 18 is formed is caused to generate a transmit signal of specified characteristics. Because the operational characteristics of the control device are known, the characteristics of the transmit signal, such as the transmit power level, when transmitted by the control device are known. And, because the attenuation level of the variable attenuator 28 of the test apparatus is also known, the transmit signal, subsequent to attenuation by the test apparatus is also known.

The PCCARD 14 of the WLAN device 12, the device under test, receives the transmit signal, once attenuated by the test apparatus. Because of the known characteristics of the transmit signal, when transmitted by the control device, and also the attenuation level of the variable attenuator, the RSSI level of the transmit signal, when received at the device under test is determinable. Measurement of the RSSI level of the transmit signal, when received at the device under test, is also made.

Differences between the measured and calculated values are determined and, responsive to such differences, calibration of the device under test is then effectuated. In the exemplary implementation, the entire calibration procedure is done automatically with the laptop computer 16 generating control signals on the line 46 to control the variable attenuator of the test apparatus to cause the transmit signal to be attenuated at different levels of attenuation. The PCCARD 22 of the control device 18 acts as an accurate power level transmitter. The PCCARD transmits in a special broadcast mode, started by the software 52 contained in the laptop computer 24. When in the special broadcast mode, the transmit signal is transmitted without waiting for responses.

During calibration procedures, the software 48 of the laptop computer 16 causes generation of control signals which control the attenuation of the variable attenuator of the test apparatus. Recordation is further made at the laptop computer of measured RSSI values together with the corresponding variable attenuator settings. Such recorded values are used to correct for offsets between the measured and actual RSSI values.

Figure 2:
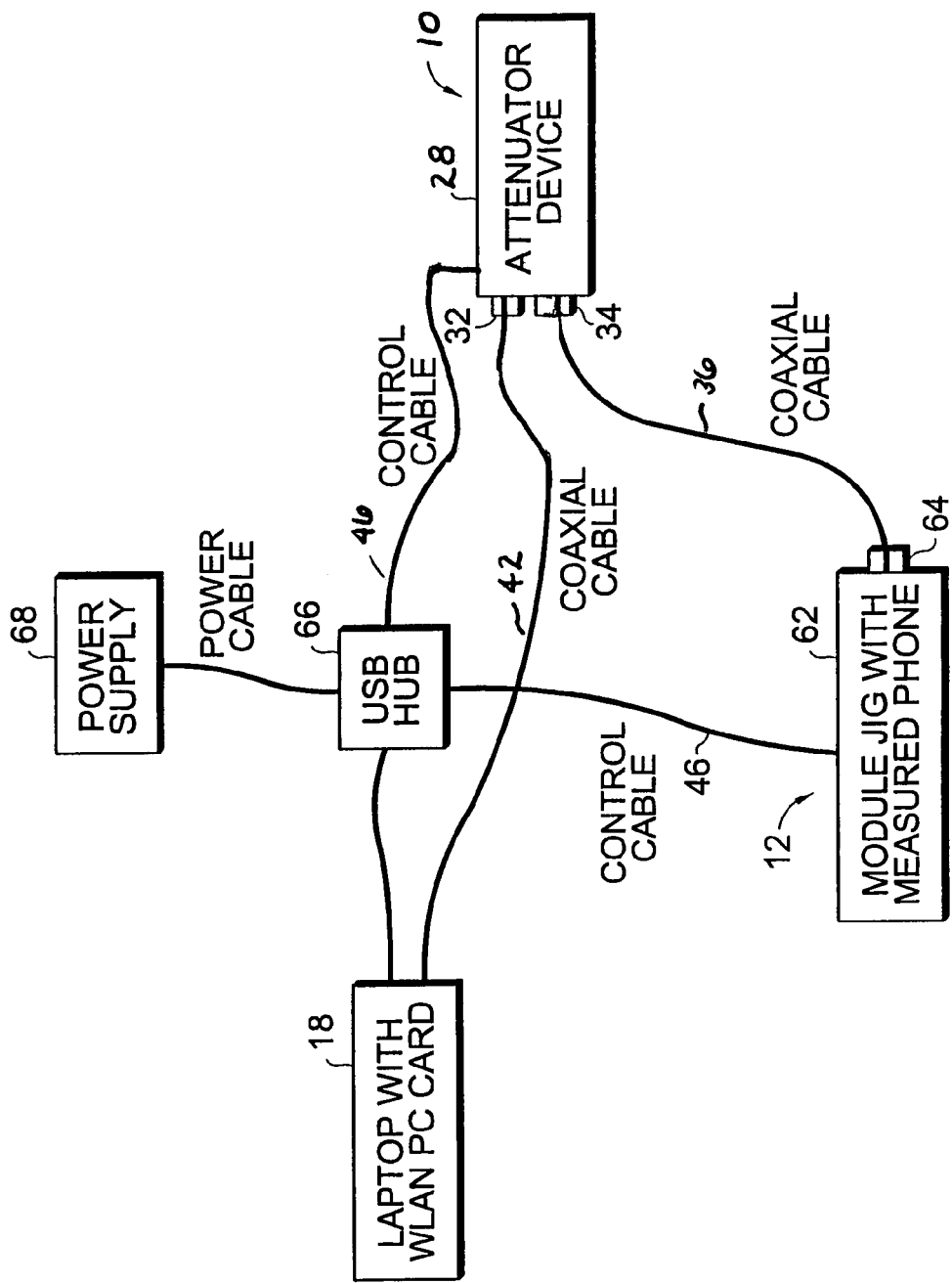
FIG. 2 illustrates a functional block diagram of the test apparatus of an embodiment of the present invention operable to test the receive portion and the transmit portion of a WLAN device to determine proper operation of the WLAN device.

FIG. 2 illustrates again the test apparatus 10, here to test for proper operation of a WLAN device, again shown at 12. In this implementation, the test apparatus 10 is utilized to perform field-testing of the WLAN device 12.

Because the test apparatus is capable of field operation and is constructed of relatively inexpensive and simple components, the conventional need for expensive measurement equipment, such as a spectrum analyzer, a frequency counter, a signal generator, and other testing equipment is obviated. Through operation of the test apparatus to field-test the device, detection of, for example, a faulty transceiver, can be made simply by establishing a connection between the faulty transceiver and a transceiver known to be in good operation by way of the test apparatus. For instance, if the power level seen by faulty receive portion of the transceiver can be set with at least a certain level of accuracy, checking of the sensitivity of the faulty receive portion of the transceiver can be performed. Analogously, if the attenuation of power transmitted by a faulty transmit portion of the transceiver can be set with at least a certain level of accuracy, the output power, and hence operation, of the faulty transceiver can also be tested.

In the exemplary implementation shown in the Figure, the WLAN device forming the device under test, is formed of a WLAN phone which is connected to a service jig 62. The service jig includes RF-probes which are connected to the phone's antenna pads or RF-switch and an antenna connector 64 to which the coaxial cable 36 is connected. The coaxial cable is also connected to a port 34 of the test apparatus. Again, the test apparatus includes a variable attenuator 28 connected between the port 34 and the port 32. A coaxial cable 42 is connected to the port 32 and to the WLAN device 18 forming the control device.

While shown pictorially in the Figure, in the exemplary implementation, the control device is also formed of a laptop computer having a WLAN PCCARD connected thereto. A USB (Universal Serial Bus) hub 66 is also shown in the Figure and is utilized if the control device is formed of a desktop personal computer and, a power supply 68 is also shown in the Figure. The power supply is utilized to power the WLAN device forming the device under test. Control cables 46 upon which control signals are generated during testing operation are also shown in the Figure.

The transmit portion of the device under test is tested during operation of one implementation of the present invention. The device under test is switched to a desired transmit power level, transmit frequency, and transmit data rate by service software embodied in the device under test. Also, the variable attenuator of the test apparatus is set to a receiving mode by appropriate generation of control signals on the control cable 46. The transmit signal of the selected transmit power level is applied to the test apparatus and is attenuated at the selected attenuation level.

An attenuated, transmit signal is provided at the port 32 and thereafter provided to the control device. The receive data, such as the received RSSI value, is recorded at a measurement log, located at either at the control device or a separate device (not shown). A check is made to ensure that the received data is correct. Measurements are performed utilizing transmit signals of varying frequencies, power levels, and data rates. The transmitted power of the device under test is calculated, based upon the attenuation setting of the variable attenuator of the test apparatus and the measured data stored at the measurement log. Results are compared against reference values stored at the control device or the separate device, as appropriate. This test thereby checks if the measured WLAN device is transmitting correct test data and, also, the test checks for the absolute-transmitted power level of the device under test.

Operation of the receive portion of the device under test is also tested during alternate operation of an embodiment of the present invention. To test the receive portion of the device under test, the control device generates a transmit signal of known characteristics. The transmit signal is attenuated at a selected level of attenuation by the variable attenuator of the test apparatus and then provided to the device under test. Measurements of the various characteristics of the transmit signal received at the device under test are made and then stored at the measurement log. Amongst the characteristics measured is the PER of the signal detected by the device under test. If the received PER and RSSI values deviate from reference values, a determination is made that the receive portion of the device under test is not properly operable.

Figure 3:
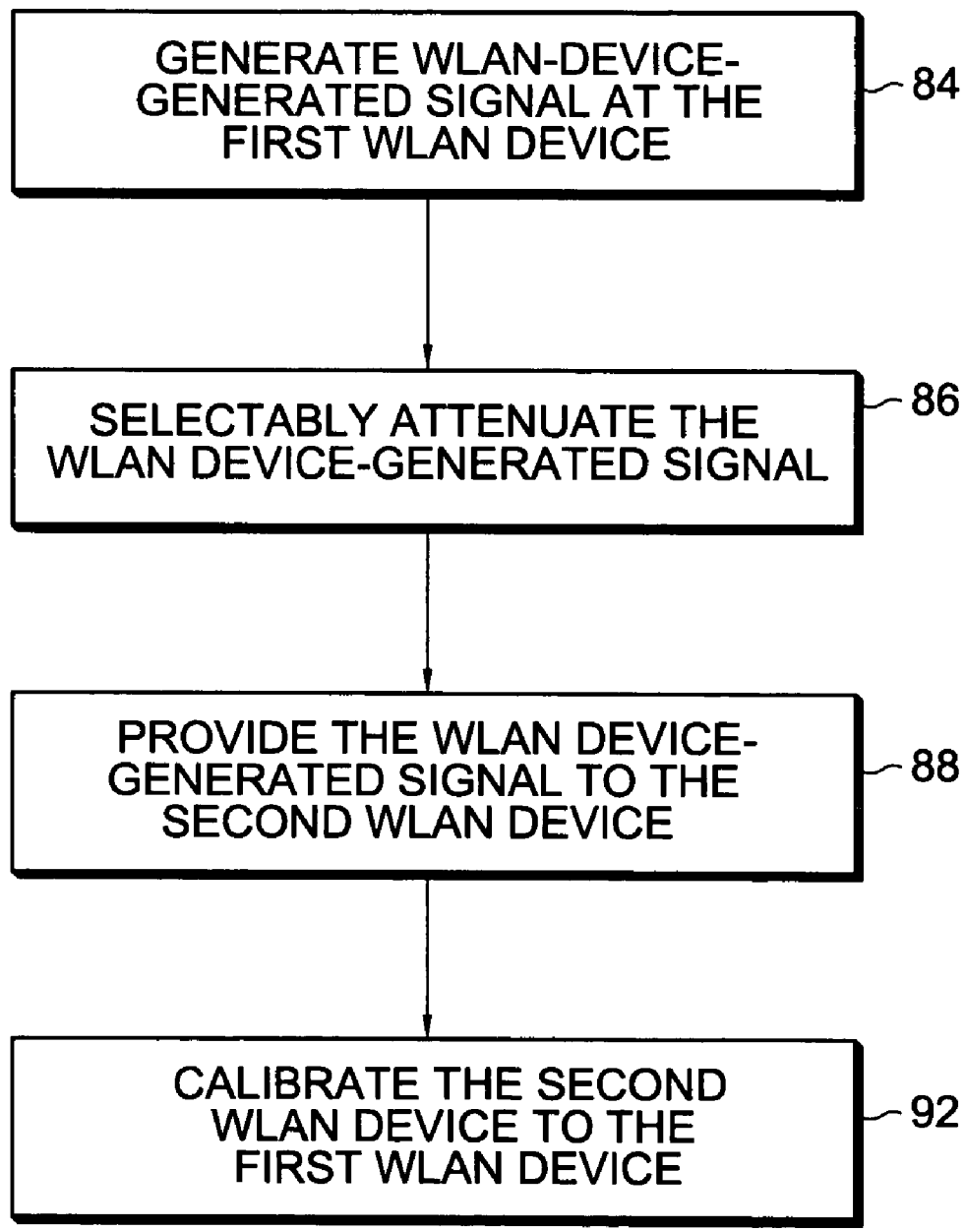
FIG. 3 illustrates a method flow diagram listing the method of operation of an embodiment of the present invention.

FIG. 3 illustrates a method, shown generally at 82, for calibrating a WLAN device in a WLAN system having a first WLAN device and at least a second WLAN device.

First, and as indicated by the block 84, a first WLAN device-generated signal is generated at the first WLAN device. Then, and as indicated by the block 86, the first WLAN device-generated signal is selectably attenuated at a selected attenuation level.

The first WLAN device-generated signal is then, and as indicated by the block 88, provided to the second WLAN device. And, as indicated by the block 92, the second WLAN device is calibrated to the first WLAN device responsive to values of the first WLAN device-generated signal.

Thereby, a manner is provided by which to field test the operation of a WLAN device. Field testing is performed by relatively simple and inexpensive apparatus and does not require sophisticated equipment to test or to calibrate the WLAN device.

The previous descriptions are of preferred examples for implementing the invention, and the scope of the invention should not necessarily be limited by this description. The scope of the present invention is defined by the following claims.

We claim:

1. In a WLAN having a first WLAN device and at least a second WLAN device, each of the first and at least second WLAN device, respectively, capable of communicating WLAN data, an improvement of apparatus for selectably connecting the first WLAN device and the second WLAN device, said apparatus comprising:

a variable attenuator having a first port selectably connectable to the first WLAN device and a second port selectably connectable to the second WLAN device, the first WLAN device forming a device under test and the second WLAN device forming a control-device, said variable attenuator for attenuating at a selected attenuation level a first WLAN device-generated signal applied to the first port when the first port is connected to the first WLAN device, and for providing an attenuated signal at the second variable-attenuator port; and a test controller coupled to the first WLAN device and selectably connectable to said variable attenuator, said test controller for selecting the selected attenuation level of said variable attenuator and for selecting parameters of the first WLAN device-generated signal.

2. The apparatus of claim 1 further comprising a first WLAN-device calibrator element, located at the first WLAN device, said first WLAN-device calibrator element for causing the first WLAN device to generate the first WLAN device-generated signal.

3. The apparatus of claim 2 wherein the first WLAN device comprises a first portable computer station having a first WLAN PCCARD selectably operable in a broadcast transmit mode, and wherein said first WLAN-device calibrator element causes the first WLAN PCCARD to operate in the broadcast mode to generate the first WLAN device-generated signal.

4. The apparatus of claim 3 further comprising a second WLAN-device calibrator element located at the second WLAN device, said second WLAN-device calibrator element for controlling operation of said variable attenuator to select the selected attenuation level of said variable attenuator.

5. The apparatus of claim 4 wherein said second WLAN-device calibrator element is further for measuring values of the attenuated signal formed by said variable attenuator and applied to the second WLAN device when the second WLAN device is connected to the second port of said variable attenuator.

6. The apparatus of claim 5 wherein the values of the attenuated signal measured by said second WLAN-device calibrator element comprise RSSI (Received Signal Strength Indication) values.

7. The apparatus of claim 5 wherein the second WLAN device comprises a second portable computer station having a second WLAN PCCARD, and wherein said second WLAN-device calibrator element is further for forming a connection function responsive to measured values of the attenuated signal formed by said variable attenuator at the selected attenuation level.

8. The apparatus of claim 7 wherein said second WLAN-device calibrator element selects the selected attenuator level of said variable attenuator to be of successively-different levels, measures the attenuated signal formed at the second port attenuated at the successively-different levels, and forms the connective function responsive thereto.

9. The apparatus of claim 1 wherein the second WLAN device is connected to the second port of said variable attenuator and wherein the second WLAN device measures values of the attenuated signal formed by said variable attenuator.

10. The apparatus of claim 9 wherein said test controller further is coupled to the second WLAN device, wherein the second WLAN device forwards measured values of the attenuated signal to said test controller.

11. The apparatus of claim 10 wherein said test controller is further operable, responsive to forwarding of the measured values thereto by the second WLAN device, to analyze operation of the first WLAN device.

12. The apparatus of claim 11 wherein the parameters of the first WLAN device-generated signal selected by said test controller comprise a desired transmit power level, a transmission frequency, and a data rate.

13. The apparatus of claim 1, wherein said variable attenuator comprises a resistive step attenuator having a plurality of resistive elements, each of the resistive elements of the plurality of resistive elements of different resistive values, wherein a selected at least one resistive is selected to be coupled to the first port, thereby to attenuate first WLAN device-generated signal at the selected attenuation level, the selected attenuation level responsive to the resistive value of the selected at least one resistive element.

14. In a WLAN having a first WLAN device and at least a second WLAN device, each of the first and at least second WLAN device, respectively, capable of communicating WLAN data, an improvement of apparatus for selectably connecting the first WLAN device and the second WLAN device, said apparatus comprising:

a variable attenuator having a first port selectably connectable to the first WLAN device and a second port selectably connectable to the second WLAN device, the first WLAN device forming a device under test and the second WLAN device forming a control-device, said variable attenuator for attenuating at a selected attenuation level a first WLAN device-generated signal applied to the first port when the first port is connected to the first WLAN device, and for providing an attenuated signal at the second variable-attenuator port; and a test controller coupled to the first WLAN device and to the second WLAN device, and selectably connectable to said variable attenuator, said test controller for selecting the selected attenuation level of said variable attenuator and for selecting parameters of the first WLAN device-generated signal.

15. The apparatus of claim 14, wherein said variable attenuator comprises a resistive step attenuator having a plurality of resistive elements, each of the resistive elements of the plurality of resistive elements of different resistive values, wherein a selected at least one resistive element is selected to be coupled to the first port, thereby to attenuate first WLAN device-generated signal at the selected attenuation level, the selected attenuation level responsive to the resistive value of the selected at least one resistive element.

16. In a WLAN having a first WLAN device and at least a second WLAN device, each of the first and at least second WLAN device, respectively, capable of communicating WLAN data, an improvement of apparatus for selectably connecting the first WLAN device and the second WLAN device, said apparatus comprising:

a variable attenuator having a first port selectably connectable to the first WLAN device and a second port selectably connectable to the second WLAN device, the first WLAN device forming a device under test and the second WLAN device forming a control-device, said variable attenuator for attenuating at a selected attenuation level a first WLAN device-generated signal at a selected attenuation level applied to the first port when the first port is connected to the first WLAN device, and for providing an attenuated signal at the second variable-attenuator port; and a test controller located in the second WLAN device, the test controller coupled to the first WLAN device and selectable connectable to said variable attenuator, said test controller for selecting the selected attenuation level of said variable attenuator and for selecting parameters of the first WLAN device-generated signal.

17. The apparatus of claim 16, wherein said variable attenuator comprises a resistive step attenuator having a plurality of resistive elements, each of the resistive elements of the plurality of resistive elements of different resistive values, wherein a selected at least one resistive element is selected to be coupled to the first port, thereby to attenuate first WLAN device-generated signal at the selected attenuation level, the selected attenuation level responsive to the resistive value of the selected at least one resistive element.

* * * * *